(12) United States Patent
Fukushima et al.

(10) Patent No.: US 6,984,582 B2
(45) Date of Patent: Jan. 10, 2006

(54) METHOD OF MAKING SEMICONDUCTOR DEVICE BY POLISHING WITH INTERMEDIATE CLEAN POLISHING

(75) Inventors: Dai Fukushima, Sagamihara (JP); Gaku Minamihaba, Yokohama (JP); Hiroyuki Yano, Yokohama (JP); Yoshikuni Tateyama, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 168 days.

(21) Appl. No.: 10/730,902

(22) Filed: Dec. 10, 2003

(65) Prior Publication Data

US 2004/0152318 A1  Aug. 5, 2004

(30) Foreign Application Priority Data

Dec. 12, 2002 (JP) .............................. 2002-360230

(51) Int. Cl.
*H01L 21/44* (2006.01)

(52) U.S. Cl. ...................... 438/633; 438/687
(58) Field of Classification Search ............... 438/633, 438/687

See application file for complete search history.

(56) References Cited

U.S. PATENT DOCUMENTS

| | | | | |
|---|---|---|---|---|
| 5,643,406 A | * | 7/1997 | Shimomura et al. ........ 438/693 |
| 5,664,990 A | * | 9/1997 | Adams et al. ................ 451/60 |
| 6,099,662 A | * | 8/2000 | Wang et al. .................. 134/26 |
| 6,143,656 A | * | 11/2000 | Yang et al. ................. 438/687 |
| 6,194,317 B1 | * | 2/2001 | Kaisaki et al. .............. 438/692 |
| 6,261,158 B1 | | 7/2001 | Holland et al. |
| 6,645,550 B1 | * | 11/2003 | Cheung et al. ............. 427/123 |
| 6,720,264 B2 | * | 4/2004 | Sahota et al. ............... 438/692 |
| 6,783,432 B2 | * | 8/2004 | Li et al. ....................... 451/36 |
| 6,855,035 B2 | * | 2/2005 | Homma et al. .............. 451/41 |
| 2002/0048958 A1 | * | 4/2002 | Kubo et al. ................. 438/692 |

FOREIGN PATENT DOCUMENTS

| | | |
|---|---|---|
| JP | 2002-083787 | 3/2002 |
| JP | 2002-141312 | 5/2002 |
| JP | 2002-541649 | 12/2002 |

* cited by examiner

*Primary Examiner*—Evan Pert
(74) *Attorney, Agent, or Firm*—Finnegan, Henderson, Farabow, Garrett & Dunner, L.L.P.

(57) ABSTRACT

A polishing method comprises supplying a polishing liquid to an upper portion of a film to be polished to carry out first polishing, the film being provided on a layer having a groove with a predetermined pattern so as to be filled therewith, after the first polishing, polishing the film to carry out clean polishing while supplying one of distilled water and a cleaning liquid thereto, and after the clean polishing, polishing a residual portion of the film remaining outside of the groove by supplying a polishing liquid to carry out second polishing.

20 Claims, 5 Drawing Sheets

METHOD OF MAKING SEMICONDUCTOR DEVICE BY POLISHING WITH INTERMEDIATE CLEAN POLISHING

BACKGROUND OF THE INVENTION

1. Field of the Invention

The present invention relates to a semiconductor device manufacturing method having a CMP (Chemical Mechanical Polishing) process.

2. Description of the Related Art

Owing to recent demands for an increase in the operating speed of logic LSIs (Large Scale Integrated Circuits) or memories, much attention has been paid to a buried wiring structure as a method of forming a wiring structure using a chemical mechanical polishing process (CMP). A wiring material is, for example, Al, Cu, or W. In particular, Cu is gathering much attention because this material has a lower resistance and a high melting point. The formation of the buried wiring structure using Cu makes it difficult to use RIE (Reactive Ion Etching) because it requires that each of wiring layers must be surrounded by a barrier metal in order to prevent the diffusion of Cu. For these and other reasons, with this method, it is essential to employ the CMP process.

FIGS. 10A and 10B show a forming method for a buried wiring structure having, for example, a fine line-like pattern according to the prior art. As shown in FIG. 10A, an insulating film 102 having a plurality of grooves 102a is formed on a silicon substrate 101. TaN is deposited over the substrate by sputtering to form a TaN liner film 103 as a barrier metal. Subsequently, Cu is deposited by sputtering and plating to form a Cu film 104 composed of a Cu seed film and a Cu wiring film. When the Cu is deposited, it must be buried in the grooves 102a having the fine line-like pattern. Accordingly, an additive is added to facilitate the deposition of the Cu.

Then, as shown in FIG. 10B, the CMP process is used to remove an unwanted part of the Cu film 104 formed outside the grooves 102a. A polishing condition is properly selected including a polishing liquid, a flow rate of the polishing liquid, a polishing pad, a polishing load, a top ring revolution speed, and a turn table revolution speed.

Subsequently, the CMP process is used to remove unwanted parts of the TaN liner film 103 (this is not shown). The polishing condition is properly selected including the polishing liquid, the flow rate of the polishing liquid, the polishing pad, the polishing load, the top ring revolution speed, and the turn table revolution speed. In this manner, the buried wiring structure is formed which has a fine line-like pattern.

FIGS. 11A and 11B show a method of forming a buried wiring structure such as an upper wiring layer of a multilayer wiring structure which has a deep depth pattern, according to the prior art. As shown in FIG. 11A, an insulating film 112 having a deep groove 112a is formed on a silicon substrate 111. TaN is deposited over the substrate by sputtering to form a TaN liner film 113 as a barrier metal. Subsequently, Cu is deposited by sputtering and plating to form a Cu film 114 composed of a Cu seed film and a Cu wiring film. When the Cu is deposited, it must be buried in the groove 112a having the deep pattern. Accordingly, the Cu film 114 must be formed to be thick to some degree, for example, as a margin for the plating method.

Then, as shown in FIG. 11B, the CMP process is used to remove an unwanted part of the Cu film 114 formed outside the groove 112a. The polishing condition is properly selected including the polishing liquid, the flow rate of the polishing liquid, the polishing pad, the polishing load, the top ring revolution speed, and the turn table revolution speed.

Subsequently, the CMP process is used to remove the unwanted part of the TaN liner film 113 and others (this is not shown). The polishing condition is properly selected including the polishing liquid, the flow rate of the polishing liquid, the polishing pad, the polishing load, the top ring revolution speed, and the turn table revolution speed. In this manner, it is possible to form a buried wiring structure such as an upper wiring layer of a multilayer wiring structure which has a deep pattern.

For example, in the buried wiring structure formed in the grooves having the fine line-like pattern, the additive added for forming the Cu film by plating raises this Cu film to form an overplating portion. If it is assumed that a thickness of the Cu film formed on the upper portion of each groove is about 600 nm and that a polishing rate is about 1 $\mu$m/min, a polishing operation can be achieved in about 60 seconds. However, actually, it takes additional time to polish the raised overplating portion. Thus, an increased overpolish time must be set. This may degrade the in-plane uniformity of a wafer.

Furthermore, the additive used to deposit the Cu film is often distributed in a surface portion thereof at a high density. This additive is similar to an oxidation inhibitor and may adhere to the polishing pad or react chemically with the polishing liquid to make the polishing rate unstable. Moreover, even by setting an increased overpolish time, the unwanted part of the Cu film cannot be sufficiently removed.

Furthermore, for example, in the buried wiring layers formed in the grooves having the deep pattern, the Cu film must be formed thickly to some degree, for example, as a margin for the plating method. Consequently, the unwanted part of the Cu film is formed thickly. If it is assumed that a thickness of the Cu film formed on the upper portion of each groove is about 2,100 nm and that the polishing rate is about 1 $\mu$m/min, a polishing operation can be achieved in about 180 seconds. However, actually, as the polishing is carried out for a long time, because of polishing residues adhered to the polishing pad or the remaining polishing liquid, the polishing rate may vary depending on a position on the wafer, the time required for polishing, and the number of wafers processed. As a result, the polishing rate may become unstable. Therefore, the polishing will actually require a much longer time.

When the polishing rate is thus unstable, it is difficult to carry out the polishing while maintaining the in-plane uniformity. This makes it necessary to carry-out the polishing for a further increased time. Thus, the overpolish time must be further increased. This may degrade the in-plane uniformity of the wafer.

FIG. 12 is a graph showing a variation in uniformity depending on the polishing time. The abscissa axis indicates a position on the wafer. The ordinate indicates a polishing rate. Reference character A denotes the uniformity of the polishing rate per 60 seconds when a polishing time is 120 seconds. Reference character B denotes the uniformity of the polishing rate when the polishing time is 60 seconds. This graph indicates that an increased polishing time makes the polishing rate unstable, thus making it difficult to carry out the polishing while maintaining the in-plane uniformity. Furthermore, the polishing rate varies depending on the position on the wafer. Consequently, overpolishing occurs in an intermediate area between a central area and a peripheral area of the wafer.

BRIEF SUMMARY OF THE INVENTION

According to a first aspect of the present invention, a polishing method comprises supplying a polishing liquid to an upper portion of a film to be polished to carry out first polishing, the film being provided on a layer having a groove with a predetermined pattern so as to be filled therewith; after the first polishing, polishing the film to carry out clean polishing while supplying one of distilled water and a cleaning liquid thereto; and after the clean polishing, polishing a residual portion of the film remaining outside of the groove by supplying a polishing liquid to carry out second polishing.

According to a second aspect of the present invention, a polishing method comprises supplying a polishing liquid to an upper portion of a film to be polished to carry out first polishing, the film being provided on a layer having a groove with a predetermined pattern so as to be filled therewith; after the first polishing, polishing the film to carry out first clean polishing while supplying distilled water thereto; after the first clean polishing, polishing the film to carry out second clean polishing while supplying a cleaning liquid thereto; after the second clean polishing, polishing the film to carry out third clean polishing while supplying distilled water thereto; and after the third clean polishing, polishing a residual portion of the film remaining outside of the groove by supplying a polishing liquid to carry out second polishing.

According to a third aspect of the present invention, a method of manufacturing semiconductor device comprises polishing an upper portion of a conductive film by supplying a polishing liquid thereto to carry out first polishing, the conductive film being formed above an insulating film, provided above a semiconductor substrate, having a groove with a predetermined pattern so that the groove is filled with the conductive film; after the first polishing, polishing the conductive film to carry out clean polishing while supplying one of distilled water and a cleaning liquid thereto; and after the clean polishing, polishing a residual portion of the conductive film remaining outside of the groove by supplying a polishing liquid to carry out second polishing.

DETAILED DESCRIPTION OF THE EMBODIMENTS

Embodiments will be described below in detail with reference to the drawings.

(First Embodiment)

FIGS. 1A to 4 show a semiconductor device manufacturing methods according to a first embodiment.

Figure 1A:
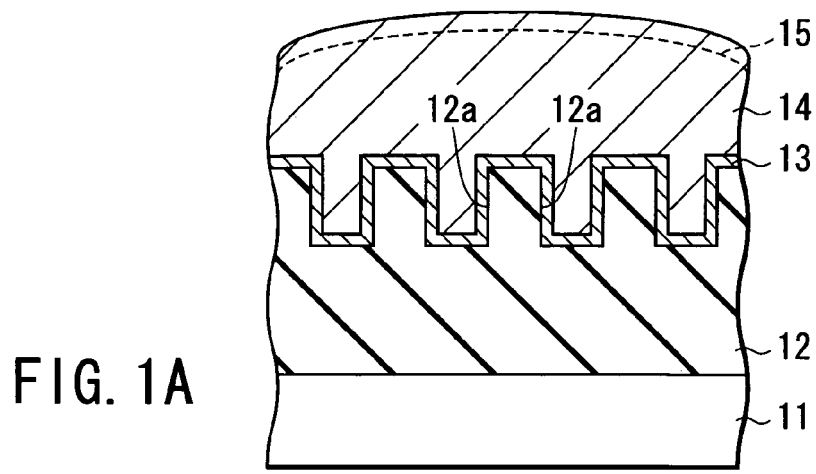
FIGS. 1A to 1D are sectional views showing a process in a semiconductor device manufacturing method according to a first embodiment.

FIGS. 1A to 1D show a method for forming a buried wiring structure having a pattern with, for example, fine lines. As shown in FIG. 1A, an insulating film 12 having a plurality of grooves 12a with a depth of 300 nm is formed on a silicon substrate 11 which includes semiconductor elements (not shown). The insulating film 12 is LKD27 (manufactured by JSR) and has a thickness of 600 nm. Then, TaN is deposited by sputtering over the substrate to form a TaN liner film 13 as a barrier metal. Subsequently, for obtaining a conductive film, Cu is deposited over the substrate surface by sputtering and plating to form a Cu film 14 composed of a Cu seed film and a Cu wiring film and having a thickness of 600 nm. The thickness of 600 nm corresponds to a part of the film formed at the upper end of the groove. When the Cu is deposited, it must be buried in the grooves 12a having the fine line-like pattern. Accordingly, an additive is added to facilitate the deposition of the Cu. Therefore, the Cu film 14 often has the raised surface configuration.

Figure 1B:
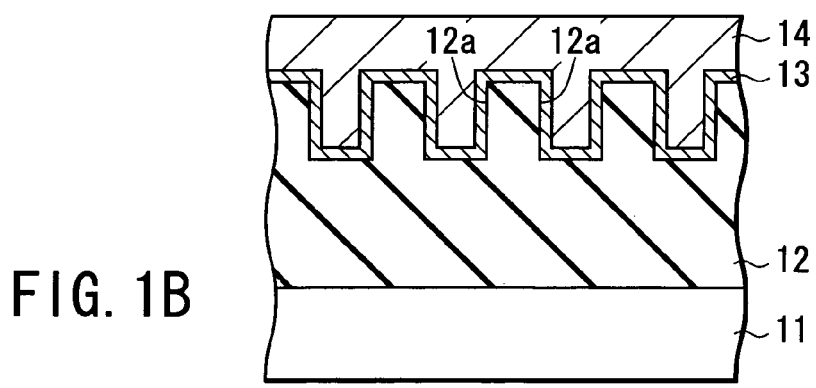

As shown in FIG. 1B, in a first polishing step for the Cu film, the CMP process is used to remove an unwanted part (upper portion) of the Cu film 104. Subsequently, in a first clean polishing step, distilled water (de-ionized water) is supplied to carry out clean polishing (this step is not shown).

Figure 1C:
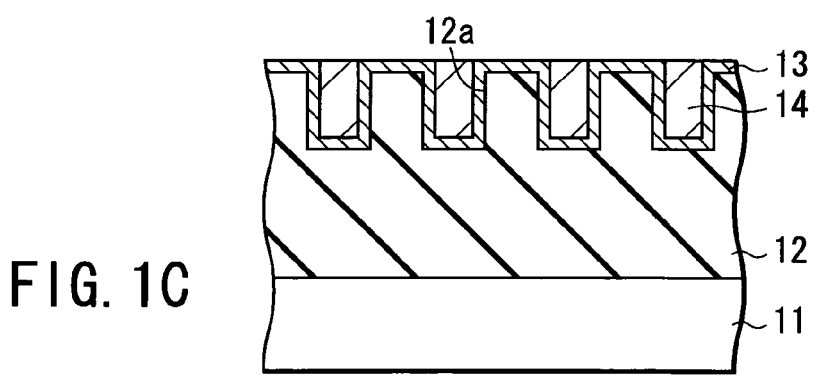

As shown in FIG. 1C, in a second polishing step for the Cu film, the CMP process is used to remove the remaining portion of the unwanted part of the Cu film 14 formed outside the grooves 12a.

Figure 1D:
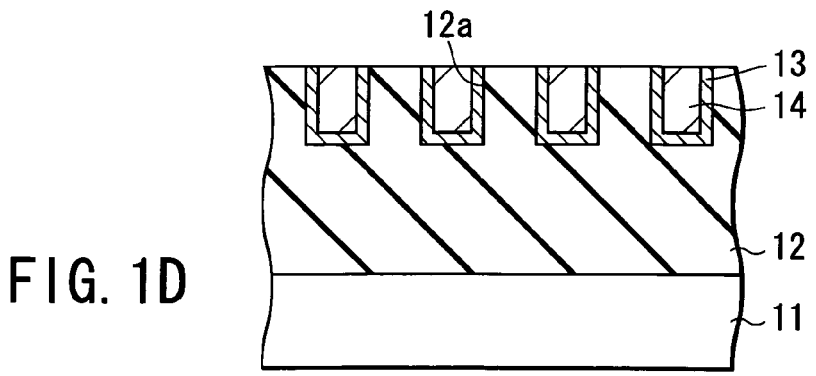

Subsequently, as shown in FIG. 1D, the CMP process is used to remove unwanted parts of the TaN liner film 103 and others. A polishing condition is properly selected including a polishing liquid, the flow rate of the polishing liquid, a polishing pad, a polishing load, a top ring revolution speed, and a turn table revolution speed. In this manner, a buried wiring structure is provided which has a fine line-like pattern.

Figure 2:
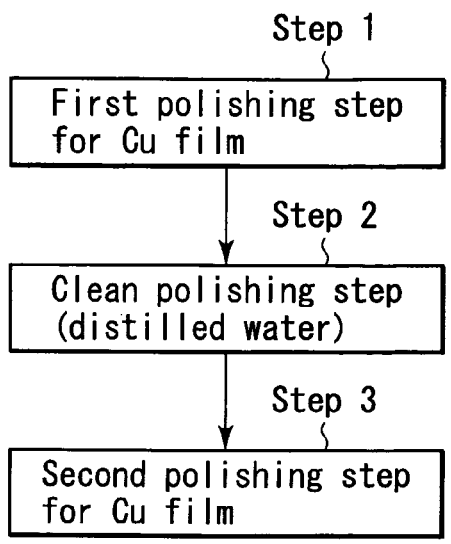
FIG. 2 is a diagram schematically showing a polishing process in the semiconductor device manufacturing method according to the first embodiment.

FIG. 2 schematically shows these polishing steps for the Cu film. In the first polishing step for the Cu film, the polishing liquid is supplied to remove the unwanted part (upper portion) of the Cu film. The polishing condition is properly selected including the polishing liquid, the flow rate of the polishing liquid, the polishing pad, the polishing load, the top ring revolution speed, and the turn table revolution speed. Here, by way of example, a condition A is selected as shown below.

Polishing condition A

Polishing liquid: CMS7303 (manufactured by JSR) +CMS7304 (manufactured by JSR)

Polishing liquid flow rate: 200 cc/min

Polishing pad: IC1000 (manufactured by RODEL)

Polishing load: 400 g/cm$^2$

Top ring revolution speed: 100 rpm

Turn table revolution speed: 100 rpm

A Cu polishing rate is 1 $\mu$m/min. In the first polishing step for the Cu film, the polishing liquid is supplied to polish the Cu film 14 for 30 seconds. In this step, the part (upper portion) of the Cu film 14 is polished.

In the clean polishing step, polishing with distilled water supplied (referred to as "water polish" herein) is carried out to clean and remove unwanted materials adhered to the polishing pad as well as the polishing liquid (step 2). For the clean polishing condition, distilled water is supplied in place of the polishing liquid specified in the polishing condition A. Furthermore, the flow rate of distilled water supplied is 200 cc/min, and the polishing is performed for 20 seconds.

In the second polishing step for the Cu film, the polishing liquid is supplied to polish the remaining unwanted part of the Cu film formed outside the grooves (step 3). The polishing condition is properly selected including the polishing liquid, the flow rate of the polishing liquid, the polishing pad, the polishing load, the top ring revolution speed, and the turn table revolution speed. In this case, the same polishing condition as that used in the first polishing step for the Cu film, i.e. the polishing condition A is selected. The Cu polishing rate is 1 $\mu$m/min. In the second polishing step for the Cu film, the polishing liquid is supplied to polish the Cu film for 30 seconds. The polishing is continuously performed until the surface of the TaN liner film is exposed, thereby removing the unwanted part of the Cu film remaining outside the grooves.

Although not shown in the drawings, in step 3, after removing the unwanted part of the Cu film remaining outside the grooves, the TaN liner film and others are polished.

In the buried wiring structure formed in the grooves having the fine line-like pattern, the additive added to form the Cu film raises this film to form an overplating portion. As shown in FIG. 1A, an additive 15 used to deposit the Cu film 14 is often distributed on the surface of the overplating portion of the Cu film at a high density. In the first polishing step for the Cu film, the surface of the Cu film 14 is polished, in which the additive 15 similar to an oxidation inhibitor is distributed at a high density. Subsequently, in the clean polishing step, water polish is carried out to remove the additive 15 adhered to the polishing pad, the remaining polishing liquid, polishing residues, organic compounds contained in a plating liquid, and the like.

In this clean polishing step, distilled water is supplied to polish, clean, and remove the additive 15, which is added during the plating method and which adheres to the polishing pad notably when the surface of the Cu film is polished. Accordingly, in the subsequent second polishing step for the Cu film, the Cu film 14 can be polished with reduced amounts of additive 15 adhered to the polishing pad, remaining polishing liquid, polishing residues, organic compounds contained in the plating liquid, and the like, in other words, with a reduced content of the additive 15 and in the initial state of the polishing process. Thus, the overplating portion of the Cu film 14 can be easily polished to reduce the overpolish time. This serves to stabilize a polishing rate to improve its uniformity.

Furthermore, these Cu polishing step and clean polishing step can be implemented on the same table. This eliminates the need to add a polishing table as a result of addition of a clean polishing step and prevents a decrease in throughput.

Moreover, the polishing time for the entire Cu film can be reduced to increase the throughput. Furthermore, since the additive added during the plating method is cleaned and removed, the overpolish time can be reduced to stabilize the polishing rate. It is also possible to remove that part of the Cu film which cannot be removed even by increasing the overpolish time. Therefore, the uniformity can be further improved.

Moreover, since distilled water is used for cleaning and removal, it is unnecessary to take into account the effect of a difference in pH between the polishing liquid and the distilled water, the effect of a complexing agent, and the like. The process can thus be implemented relatively easily and can produce significant advantages.

(First Variation)

Figure 3:
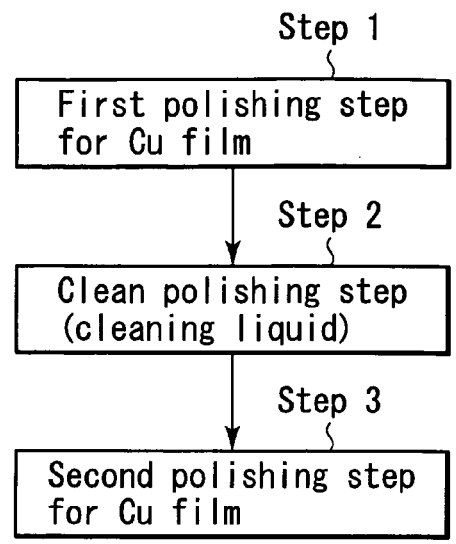
FIG. 3 is a diagram schematically showing a polishing process in a semiconductor device manufacturing method according to a first variation of the first embodiment.

FIG. 3 schematically shows other polishing process for the Cu film. In the first polishing step for the Cu film, the polishing liquid is supplied to remove the unwanted part (upper portion) of the Cu film (step 1). The polishing condition is properly selected including the polishing liquid, the flow rate of the polishing liquid, the polishing pad, the polishing load, the top ring revolution speed, and the turn table revolution speed. Here, by way of example, the above condition A is selected. The Cu polishing rate is 1 $\mu$m/min. In the first polishing step for the Cu film, the polishing liquid is supplied to polish the Cu film for 30 seconds.

Then, in the clean polishing step, polishing with a cleaning liquid supplied (referred to as "cleaning liquid polish" herein) is carried out to clean and remove materials adhered to the polishing pad as well as the polishing liquid (step 2). The cleaning liquid is, for example, a citric acid and is selected taking into account the effect of a difference in pH of the polishing liquid. For the polishing condition, the cleaning liquid is supplied in place of the polishing liquid specified in the polishing condition A. Furthermore, the flow rate of cleaning liquid supplied is 200 cc/min, and the polishing is performed for 20 seconds.

Subsequently, in the second polishing step for the Cu film, the polishing liquid is supplied to polish the unwanted remaining portion of the Cu film formed outside the grooves (step 3). The polishing condition is properly selected including the polishing liquid, the flow rate of the polishing liquid, the polishing pad, the polishing load, the top ring revolution speed, and the turn table revolution speed. In this case, the same polishing condition as that used in the first polishing step for the Cu film, i.e. the polishing condition A is selected. The Cu polishing rate is 1 $\mu$m/min. In the second polishing step for the Cu film, the polishing liquid is supplied to polish the Cu film for 30 seconds. The polishing is continuously performed until the surface of the TaN liner film is exposed, thereby removing the unwanted part of the Cu film remaining outside the grooves. Although not shown in the drawings, in step 3, after removing the unwanted part of the Cu film remaining outside the grooves, the TaN liner film and others are polished.

In this clean polishing step, the cleaning liquid is supplied to polish, clean, and remove the additive which is added during the plating method and which adheres to the polishing pad notably when the surface of the Cu film is polished. Accordingly, the cleaning can be efficiently performed.

(Second Variation)

Figure 4:
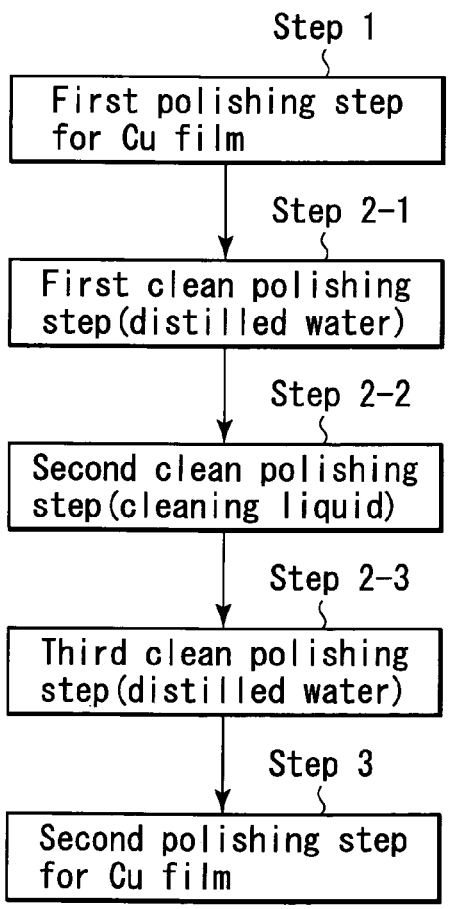
FIG. 4 is a diagram schematically showing a polishing process in a semiconductor device manufacturing method according to a second variation of the first embodiment.

FIG. 4 schematically shows other polishing process for the Cu film. In the first polishing step for the Cu film, the polishing liquid is supplied to remove the unwanted part (upper portion) of the Cu film (step 1). The polishing condition is properly selected including the polishing liquid, the flow rate of the polishing liquid, the polishing pad, the polishing load, the top ring revolution speed, and the turn table revolution speed. Here, by way of example, the above condition A is selected. The Cu polishing rate is 1 $\mu$m/min. In the first polishing step for the Cu film, the polishing liquid is supplied to polish the Cu film for 30 seconds.

Then, in a first clean polishing step, polishing with distilled water supplied (referred to as "water polish" herein) is carried out to clean and remove materials adhered to the polishing pad as well as the polishing liquid (step 2-1). Subsequently, in a second clean polishing step, polishing with a cleaning liquid supplied (referred to as "cleaning liquid polish" herein) is carried out to clean and remove materials adhered to the polishing pad as well as the polishing liquid (step 2-2). The cleaning liquid is, for example, a citric acid. Moreover, in a third clean polishing step, polishing with distilled water supplied is carried out to further clean and remove the materials adhered to the polishing pad as well as the polishing liquid (step 2-3). The cleaning liquid is selected taking into account the effect of a difference in pH of the polishing liquid to some degree. For the polishing conditions, distilled water or the cleaning liquid is supplied in place of the polishing liquid specified in the polishing condition A. Furthermore, the flow rate of cleaning liquid supplied is 200 cc/min, and the polishing is performed for 5 seconds in step 2-1, for 10 seconds in step 2-2, and for 5 seconds in step 2-3; a total of 20 seconds.

Thereafter, in the second polishing step for the Cu film, the polishing liquid is supplied to polish the remaining portion of the unwanted part of the Cu film formed outside the grooves (step 3). The polishing condition is properly selected including the polishing liquid, the flow rate of the polishing liquid, the polishing pad, the polishing load, the top ring revolution speed, and the turn table revolution speed. In this case, the same polishing condition as that used in the first polishing step for the Cu film, i.e. the polishing condition A is selected. The Cu polishing rate is 1 $\mu$m/min. In the second polishing step for the Cu film, the polishing liquid is supplied to polish the Cu film for 30 seconds. The polishing is continuously performed until the surface of the TaN liner film is exposed, thereby removing the unwanted part of the Cu film remaining outside the grooves. Although not shown in the drawings, in step 3, after removing the unwanted part of the Cu film remaining outside the grooves, the TaN liner film and others are polished.

In the first clean polishing step, the water polish is carried out to remove the additive adhered to the polishing pad, the remaining polishing liquid, polishing residues, organic compounds contained in the plating liquid, and the like. In the subsequent second clean polishing step, the cleaning liquid polish is carried out to further and efficiently remove and clean the additive adhered to the polishing pad, the remaining polishing liquid, the polishing residues, the organic compounds contained in the plating liquid, and the like. In the subsequent third clean polishing step, the water polish is carried out to remove and clean the remaining cleaning liquid used in the second clean polishing step, in addition to the additive adhered to the polishing pad, the remaining polishing liquid, the polishing residues, the organic compounds contained in the plating liquid, and the like. Thus, the process can be implemented relatively easily and can produce significant advantages, without the need to seriously take into account the effect of a difference in pH of the polishing liquid, the effect of a complexing agent, and the like.

Moreover, in the description of the first variation shown in FIG. 3, the cleaning liquid is supplied in step 2, i.e. the clean polishing step carried out between the first polishing step and second polishing step for the Cu film. However, a cleaning operation (a step composed only of cleaning) may be performed either before or after step 2 or both before and after this step, using distilled water. In this case, the substrate must be moved and cleaned in a different unit. However, advantages can be obtained such as an improvement in uniformity.

Furthermore, in the description of the second variation shown in FIG. 4, the distilled water, the cleaning liquid, and the distilled water are supplied in this order during steps 2-1 to 2-3, i.e. the first to third clean polishing steps. However, the advantages shown in the first variation can be obtained even if the water polish in step 2-1 or 2-3 is omitted.

In the description of the above embodiment, the TaN film is used as the barrier metal but is not limited to this material. As the barrier metal, Mo, Ti, TiN, WN, Nb, Ag, or the like may be used. Furthermore, in the above description, the Cu film is used as the wiring material. However, Al, W, or Ag may be employed as the wiring material.

Furthermore, in the description of the above embodiment, the buried wiring structure has, for example, the fine line-like pattern, but is not limited to this pattern. The same advantages can be obtained by applying such a concept to a buried wiring structure using a wiring material containing an additive such as an oxidation inhibitor.

The polishing time in the first polishing step for the Cu film, the clean polishing step, and the second polishing step for the Cu film is given by 30, 20, and 30 seconds, respectively, but is not limited to such a time. The polishing time in the first polishing step for the Cu film, the clean polishing step, and the second polishing step for the Cu film may be set at 20, 20, and 40 seconds, respectively. By performing the clean polishing step in a first-half stage within the entire polishing process, it is preferably possible to remove early polishing residues resulting from polishing of the upper portion of the Cu film containing the additive.

The polishing time required for the first polishing step for the Cu film, the clean polishing step, and the second polishing step for the Cu film may be set at 40, 20, and 20 seconds, respectively. However, when the Cu film remaining on the grooves is overpolished, if large amounts of additive adhered to the polishing pad, remaining polishing liquid, polishing residues, organic compounds contained in the plating liquid, and the like remain without being removed, then a longer time is required for the overpolish. This hinders the stabilization of the polishing rate to degrade the in-plane uniformity. Therefore, the clean polishing step is preferably completed before the overpolish step of the Cu film polishing process at the latest.

(Second Embodiment)

FIGS. 5A to FIG. 9 show a semiconductor device manufacturing method according to a second embodiment.

Figure 5A:
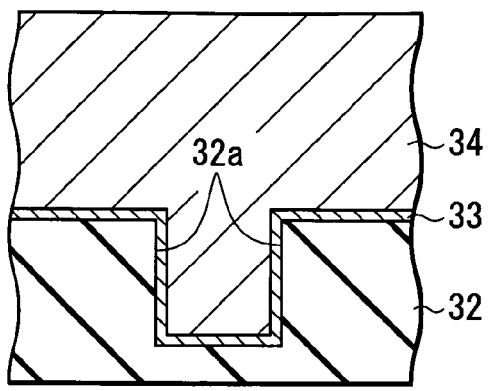
FIGS. 5A to 5D are sectional views showing a process in a semiconductor device manufacturing method according to a second embodiment.

FIGS. 5A to 5D show a forming method for a buried wiring structure having, for example, a pattern with a deep depth. As shown in FIG. 5A, an insulating film 32 having a groove 32a with a depth of 1,500 nm is formed on a silicon substrate 31 which includes semiconductor elements (not shown). The insulating film 32 is LKD27 (manufactured by JSR) and has a thickness of 1,800 nm. Then, TaN is deposited by sputtering over the substrate to provide a TaN liner film 33 as a barrier metal. Subsequently, for obtaining a conductive film, Cu is deposited over the substrate surface by sputtering and plating to form a Cu film 34 composed of a Cu seed film and a Cu wiring film and having a thickness of 2,500 nm. The thickness of 2,500 nm is the film thickness at the upper end of the groove. When the Cu is deposited, it must be buried in the groove 32$a$ having the deep depth. Accordingly, a somewhat large Cu film must be formed, for example, as a margin for the plating method. As a result, an unwanted part of the Cu film is formed thick. In the above description, the Cu film is formed as the conductive film, but is not limited thereto. Furthermore, in the above, the Cu film is formed using the sputtering plating, but is not limited thereto.

Figure 5B:
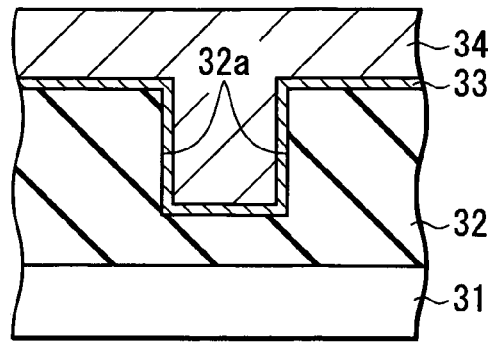

As shown in FIG. 5B, in a first polishing step for the conductive film, the CMP process is used to remove an upper portion of an unwanted part of the Cu film 34. Subsequently, in a clean polishing step, distilled water is supplied to carry out clean polishing (this step is not shown).

Figure 5C:
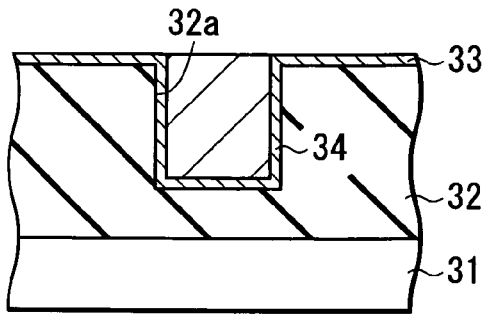

As shown in FIG. 5C, in a second polishing step for the conductive film, the CMP process is used to remove the remaining portion of the unwanted part of the Cu film 34 formed outside the groove.

Figure 5D:
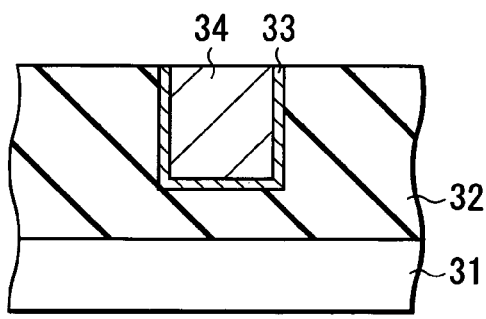

Subsequently, as shown in FIG. 5D, the CMP process is used to remove unwanted parts of the TaN liner film 33 and others. The polishing condition is properly selected including the polishing liquid, the flow rate of the polishing liquid, the polishing pad, the polishing load, the top ring revolution speed, and the turn table revolution speed.

Figure 6:
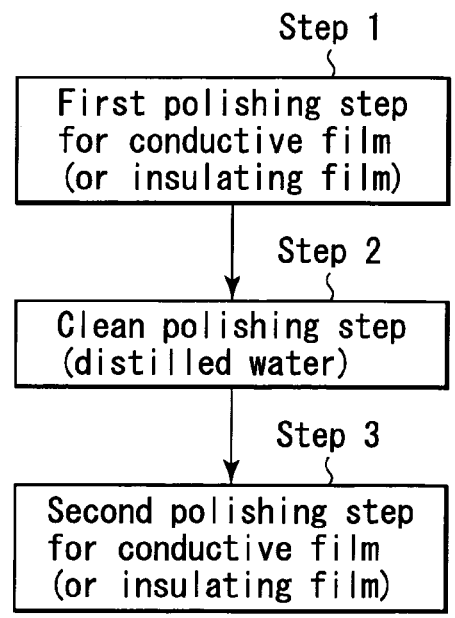
FIG. 6 is a diagram schematically showing a polishing process in the semiconductor device manufacturing method according to the second embodiment.

FIG. 6 schematically shows these polishing steps for the Cu film formed as the conductive film. In the first polishing step for the Cu film, the polishing liquid is supplied to remove the upper portion of the unwanted part of the Cu film (step 1). The polishing condition is properly selected including the polishing liquid, the flow rate of the polishing liquid, the polishing pad, the polishing load, the top ring revolution speed, and the turn table revolution speed. Here, by way of example, condition B is selected as shown below.

Polishing condition B
    Polishing liquid: CMS7303 (manufactured by JSR) +CMS7304 (manufactured by JSR)
    Polishing liquid flow rate: 200 cc/min
    Polishing pad: IC1000 (manufactured by RODEL)
    Polishing load: 400 g/cm$^2$
    Top ring revolution speed: 100 rpm
    Turn table revolution speed: 100 rpm The Cu polishing rate is 1 $\mu$m/min. In the first polishing step for the conductive film, the polishing liquid is supplied to polish the Cu film 34 for 60 seconds. In this step, the upper portion of the Cu film 34 is polished.

In the clean polishing step, polishing with distilled water supplied (referred to as "water polish" herein) is carried out to clean and remove materials adhered to the polishing pad as well as the polishing liquid (step 2). For the polishing condition, distilled water is supplied in place of the polishing liquid specified in the polishing condition B.

Furthermore, the flow rate of distilled water supplied is 200 cc/min, and the polishing is performed for 20 seconds.

In the second polishing step for the conductive film, the polishing liquid is supplied to polish the remaining portion of the unwanted part of the Cu film formed outside the grooves (step 3). The polishing condition is properly selected including the polishing liquid, the flow rate of the polishing liquid, the polishing pad, the polishing load, the top ring revolution speed, and the turn table revolution speed. In this case, the same polishing condition as that used in the first polishing step for the Cu film, i.e. the polishing condition B is used. The Cu polishing rate is 1 $\mu$m/min. In the second polishing step for the conductive film, the polishing liquid is supplied to polish the Cu film for 90 seconds. The polishing is continuously performed until the surface of the TaN liner film is exposed, thereby removing the unwanted part of the Cu film remaining outside the grooves. Although not shown in the drawings, in step 3, after removing the unwanted part of the Cu film remaining outside the grooves, the TaN liner film and others are polished.

In the buried wiring structure formed in the grooves having the deep pattern, the unwanted part of the Cu film is formed thick. In the first polishing step for the conductive film, the upper portion of the unwanted part of the Cu film is polished. Subsequently, in the clean polishing step, the water polish is carried out to remove and clean the remaining polishing liquid adhered to the polishing pad, polishing residues, and the like, all of which result from the first polishing step for the conductive film. Thus, in the subsequent second polishing step for the Cu film, the Cu film can be polished in the initial state of the polishing process, i.e. with only small amounts of remaining polishing liquid adhered to the polishing pad, polishing residues, and the like. As a result, even if a relatively thick Cu film is polished, it is possible to reduce the overpolish time, thereby stabilizing the polishing rate. This improves the uniformity.

Figure 7:
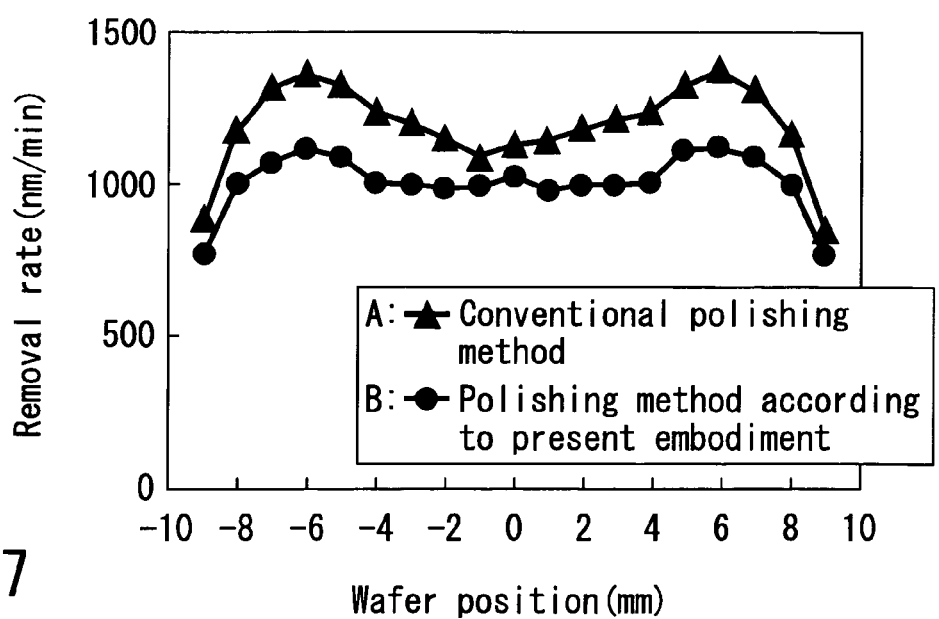
FIG. 7 is a graph showing a comparison of a semiconductor device manufacturing method according to the prior art with the semiconductor device manufacturing method according to the second embodiment, in terms of the uniformity of the wafer in the polishing rate.

FIG. 7 is a graph showing a comparison of the uniformity between this embodiment and the polishing method according to the prior art. The axis of abscissa indicates a position on a wafer. The axis of ordinate indicates the polishing rate. Reference character A denotes the uniformity of the polishing rate per 60 seconds in the polishing method of the prior art when a polishing time is 120 seconds. Reference character B denotes the uniformity of the polishing rate per 60 seconds in the polishing method of the present embodiment when the polishing time is 120 seconds. It is apparent that the polishing rate is stabilized to improve the in-plane uniformity of the wafer as compared to the prior art.

Furthermore, the polishing step of the conductive film and clean polishing step thereof can be implemented on the same table. This eliminates the need to add a polishing table due to addition of a clean polishing step and prevents a decrease in throughput.

Moreover, since distilled water is used for cleaning and removing, it is unnecessary to take into account the effect of a difference in pH of the polishing liquid, the effect of a complexing agent, and the like. The process can thus be implemented relatively easily and can produce significant advantages. It is also possible to reduce the polishing time for the entire Cu film, thereby improving the throughput.

(First Variation)

Figure 8:
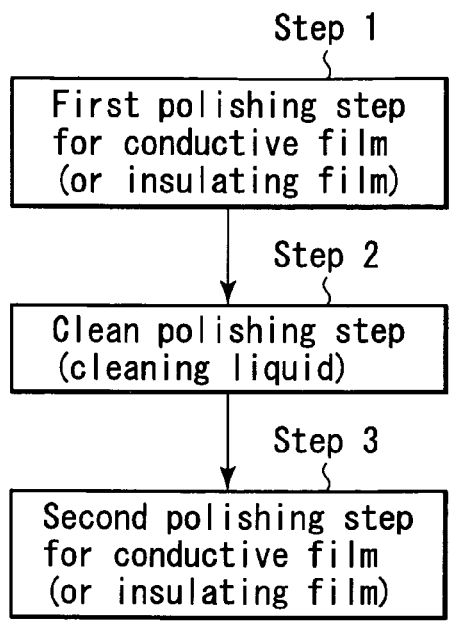
FIG. 8 is a diagram schematically showing a polishing process in a semiconductor device manufacturing method according to a first variation of the second embodiment.

FIG. 8 schematically shows other polishing process for the Cu film formed as a conductive film. In the first polishing step for the conductive film, the polishing liquid is supplied to remove the upper portion of the unwanted part of the Cu film (step 1). The polishing condition is properly selected including the polishing liquid, the flow rate of the polishing liquid, the polishing pad, the polishing load, the top ring revolution speed, and the turn table revolution speed. Here, by way of example, the above condition B is selected. The Cu polishing rate is 1 μm/min. In the first polishing step for the conductive film, the polishing liquid is supplied to polish the Cu film for 60 seconds.

In the clean polishing step, polishing with a cleaning liquid supplied (referred to as "cleaning liquid polish" herein) is carried out to clean and remove materials adhered to the polishing pad as well as the polishing liquid (step 2). The cleaning liquid is, for example, a citric acid and is selected taking into account the effect of a difference in pH of the polishing liquid. For the polishing condition, the cleaning liquid is supplied in place of the polishing liquid specified in the polishing condition B. Furthermore, the flow rate of cleaning liquid supplied is 200 cc/min, and the polishing is performed for 20 seconds.

In the second polishing step for the Cu film, the polishing liquid is supplied to polish the remaining portion of the unwanted part of the Cu film formed outside the grooves (step 3). The polishing condition is properly selected including the polishing liquid, the flow rate of the polishing liquid, the polishing pad, the polishing load, the top ring revolution speed, and the turn table revolution speed. In this case, the same polishing condition as that used in the first polishing step for the Cu film, i.e. the polishing condition B is selected. The Cu polishing rate is 1 μm/min. In the second polishing step for the Cu film, the polishing liquid is supplied to polish the Cu film for 90 seconds. The polishing is continuously performed until the surface of the TaN liner film is exposed, thereby removing the unwanted part of the Cu film remaining outside the grooves. Although not shown in the drawings, in step 3, after removing the unwanted part of the Cu film remaining outside the grooves, the TaN liner film and others are polished.

In the clean polishing step, the cleaning liquid polish is carried out to remove and clean the remaining polishing liquid adhered to the polishing pad, polishing residues, and the like, all of which result from the first polishing step for the conductive film. This serves to achieve efficient cleaning.

(Second Variation)

Figure 9:
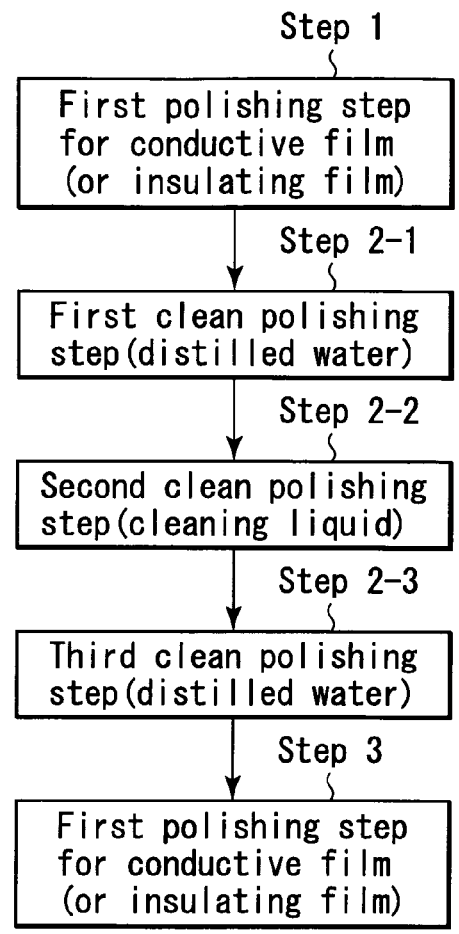
FIG. 9 is a diagram schematically showing a polishing process in a semiconductor device manufacturing method according to a second variation of the second embodiment.
Figure 12:
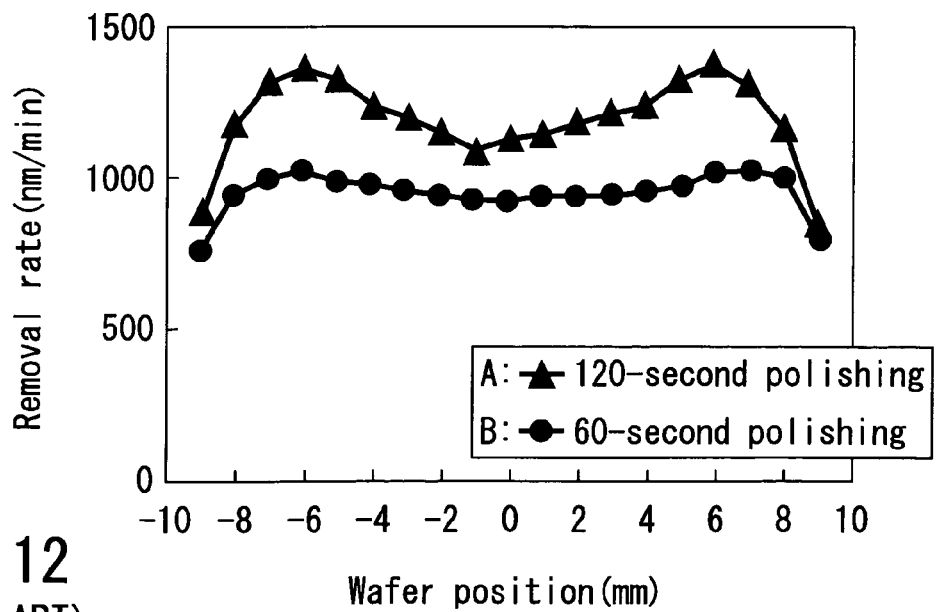
FIG. 12 is a graph showing the uniformity of the wafer in the polishing rate per 60 seconds when the polishing time in the semiconductor device manufacturing method of the prior art is 120 seconds and 60 seconds, respectively.
Figures 10A, 10B:
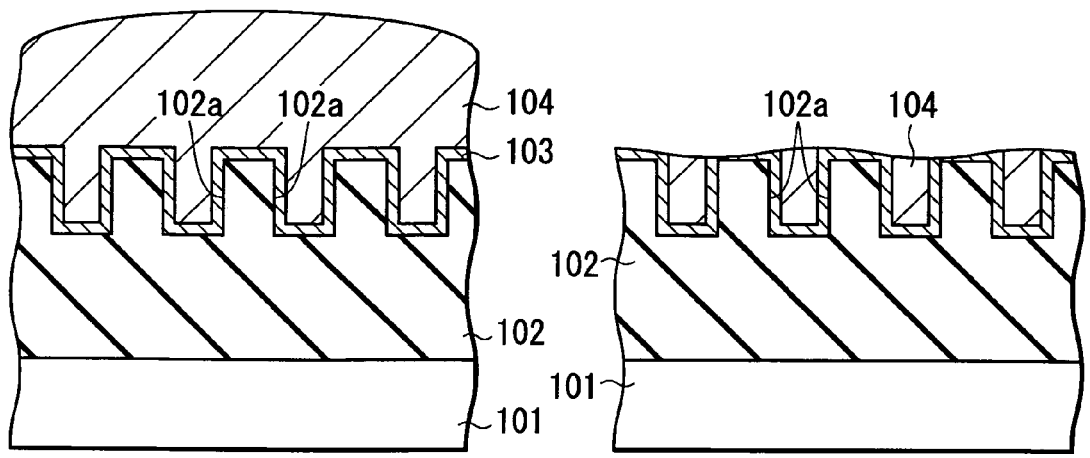
FIGS. 10A and 10B are sectional views showing a process in a semiconductor device manufacturing method according to the prior art.
Figures 11A, 11B:
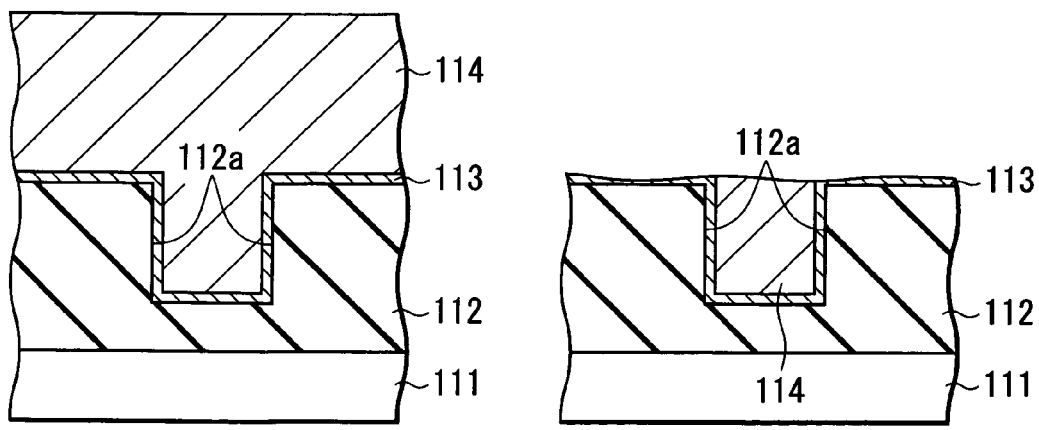
FIGS. 11A and 11B are sectional views showing a process in another manufacturing method for a semiconductor device according to the prior art.

FIG. 9 schematically shows other polishing process for the Cu film formed as a conductive film. In the first polishing step for the Cu film, the polishing liquid is supplied to remove the portion (upper portion) of the unwanted part of the Cu film (step 1). The polishing condition is properly selected including the polishing liquid, the flow rate of the polishing liquid, the polishing pad, the polishing load, the top ring revolution speed, and the turn table revolution speed. Here, by way of example, the above condition B is selected. The Cu polishing rate is 1 μm/min. In the first polishing step for the conductive film, the polishing liquid is supplied to polish the Cu film for 60 seconds.

Then, in a first clean polishing step, polishing with distilled water supplied (referred to as "water polish" herein) is carried out to clean and remove materials adhered to the polishing pad as well as the polishing liquid (step 2-1). Subsequently, in a second clean polishing step, polishing with a cleaning liquid supplied (referred to as "cleaning liquid polish" herein) is carried out to clean and remove materials adhered to the polishing pad as well as the polishing liquid (step 2-2). The cleaning liquid is, for example, a citric acid. Moreover, in a third clean polishing step, polishing with distilled water supplied is carried out to further clean and remove the materials adhered to the polishing pad as well as the polishing liquid (step 2-3). The cleaning liquid is selected taking into account the effect of a difference in pH of the polishing liquid to some degree. For the polishing condition, distilled water or the cleaning liquid is supplied in place of the polishing liquid specified in the polishing condition B. Furthermore, the flow rate of cleaning fluid supplied is 200 cc/min, and the polishing is performed for 5 seconds in step 2-1, for 10 seconds in step 2-2, and for 5 seconds in step 2-3; a total of 20 seconds.

Subsequently, in the second polishing step for the Cu film, the polishing liquid is supplied to polish the remaining portion of the unwanted part of the Cu film formed outside the grooves (step 3). The polishing condition is properly selected including the polishing liquid, the flow rate of the polishing liquid, the polishing pad, the polishing load, the top ring revolution speed, and the turn table revolution speed. In this case, the same polishing condition as that used in the first polishing step for the Cu film, i.e. the polishing condition B is selected. The Cu polishing rate is 1 μm/min. In the second polishing step for the Cu film, the polishing liquid is supplied to polish the Cu film for 90 seconds. The polishing is continuously performed until the surface of the TaN liner film is exposed, thereby removing the unwanted part of the Cu film remaining outside the grooves. Although not shown in the drawings, in step 3, after removing the unwanted part of the Cu film remaining outside the grooves, the TaN liner film and others are polished.

In the first clean polishing step, the water polish is carried out to remove the polishing liquid remaining on the polishing pad, polishing residues, and the like. In the subsequent second clean polishing step, the cleaning liquid polish is carried out to further and efficiently remove and clean the polishing liquid remaining on the polishing pad, polishing residues, and the like. In the subsequent third clean polishing step, the water polish is carried out to remove and clean the remaining cleaning liquid used in the second clean polishing step, in addition to the polishing liquid remaining on the polishing pad, polishing residues, and the like. Thus, the process can be implemented relatively easily and can produce significant advantages, without the need to seriously take into account the effect of a difference in pH between the polishing liquid and the cleaning liquid, the effect of a complexing agent, and the like.

Moreover, in the description of the first variation shown in FIG. 8, the cleaning liquid is supplied in step 2, i.e. the clean polishing step carried out between the first polishing step and second polishing step for the conductive film. However, a cleaning operation (a step composed only of cleaning) may be performed either before or after step 2 or both before and after this step, using distilled water. In this case, the substrate must be moved and cleaned in a different unit. However, advantages can be obtained such as the improvement in the uniformity.

Furthermore, in the description of the second variation shown in FIG. 9, the distilled water, the cleaning liquid, and the distilled water are supplied in this order during steps 2-1 to 2-3, i.e. the first to third clean polishing steps. However, the advantages shown in the first variation can be obtained even if the water polish in step 2-1 or 2-3 is omitted.

In the above embodiment, the barrier metal is composed of the TaN film. As the barrier metal, Mo, Ti, TiN, WN, Nb, Ag, or the like may be used. Furthermore, in the above description, the Cu film is used as the wiring material, but is not limited thereto. Al, W, or Ag may be used as the wiring material.

Furthermore, in the above description, the wiring structure is provided using the plating method. However, another method may be used to form it.

In the embodiment, the buried wiring structure has, for example, the pattern with the deep depth. However, the structure is not limited to such pattern. A good advantage can be obtained when the polishing technique is applied to a relatively thick film or the like which must be polished for a long time. Furthermore, the polished film is not limited to the wiring material. The similar advantage can be obtained in a buried insulating film formed by an STI (Shallow Trench Isolation) process.

In the present embodiment, the polishing time in the first polishing step for the conductive film, the clean polishing step, and the second polishing step for the conductive film is 60, 20, and 90 seconds, respectively, but each polishing time is not limited thereto. The polishing time in the first polishing step for the conductive film, the clean polishing step, and the second polishing step for the conductive film may be set at 90, 20, and 60 seconds, respectively. By thus performing the clean polishing step in the middle stage of the entire polishing process, it is preferably possible to remove polishing residues resulting from polishing of a part of the conductive film and continue to carry out polishing in a state similar to the initial state of the polishing process of the conductive film.

As described above, with respect to the first and second embodiments, the same polishing condition is selected in the polishing step for the film by using the polishing liquid, and in the first and second polishing steps. However, the present invention is not limited to this aspect. The polishing steps can be executed by selecting different polishing conditions. Furthermore, in the description of the first and second embodiments, one clean polishing step is executed during the process of polishing the film to be polished using the polishing liquid. However, the present invention is not limited to this aspect. A plurality of clean polishing steps may be executed in the middle stage of the process of polishing the polished film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A polishing method comprising:
   supplying a polishing liquid to an upper portion of a film to be polished to carry out first polishing, the film being provided on a layer having a groove with a predetermined pattern so as to be filled therewith;
   after the first polishing, polishing the film to carry out clean polishing while supplying one of distilled water and a cleaning liquid thereto; and
   after the clean polishing, polishing a residual portion of the film remaining outside of the groove by supplying a polishing liquid to carry out second polishing.

2. The polishing method according to claim 1, wherein a process composed of the first polishing, the clean polishing, and the second polishing is CMP.

3. The polishing method according to claim 1, wherein the clean polishing is water polishing.

4. The polishing method according to claim 1, wherein the first and second polishing and the clean polishing are carried out on the same table.

5. The polishing method according to claim 1, wherein the film is a conductive film.

6. A polishing method comprising:
   supplying a polishing liquid to an upper portion of a film to be polished to carry out first polishing, the film being provided on a layer having a groove with a predetermined pattern so as to be filled therewith;
   after the first polishing, polishing the film to carry out first clean polishing while supplying distilled water thereto;
   after the first clean polishing, polishing the film to carry out second clean polishing while supplying a cleaning liquid thereto;
   after the second clean polishing, polishing the film to carry out third clean polishing while supplying distilled water thereto; and
   after the third clean polishing, polishing a residual portion of the film remaining outside of the groove by supplying a polishing liquid to carry out second polishing.

7. The polishing method according to claim 6, wherein a process composed of the first polishing, the first to third clean polishing, and the second polishing is CMP.

8. The polishing method according to claim 6, wherein the first and third clean polishing is water polishing.

9. The polishing method according to claim 6, wherein the first and second polishing and the first to third clean polishing are carried out on the same table.

10. A method of manufacturing a semiconductor device comprising:
    polishing an upper portion of a conductive film by supplying a polishing liquid thereto to carry out first polishing, the conductive film being formed above an insulating film, provided above a semiconductor substrate, having a groove with a predetermined pattern so that the groove is filled with the conductive film;
    after the first polishing, polishing the conductive film to carry out clean polishing while supplying one of distilled water and a cleaning liquid thereto; and
    after the clean polishing, polishing a residual portion of the conductive film remaining outside of the groove by supplying a polishing liquid to carry out second polishing.

11. The method according to claim 10, wherein a process composed of the first polishing, the clean polishing, and the second polishing is CMP.

12. The method according to claim 10, wherein the clean polishing is water polishing.

13. The method according to claim 10, wherein the first and second polishing and the clean polishing are carried out on the same table.

14. The method according to claim 10, wherein the clean polishing includes polishing the conductive film to carry out clean polishing while supplying distilled water at least one of before and after polishing it by supplying the cleaning liquid.

15. The method according to claim 10, further comprising:
    cleaning the conductive film by using the distilled water at least one of before and after the clean polishing.

16. The method according to claim 10, wherein the conductive film is formed via a barrier metal over the insulating film having the groove with the predetermined pattern.

17. The method according to claim 10, wherein the conductive film is formed by sputtering and plating.

18. The method according to claim 10, wherein the conductive film is one of Cu, Al, W, and Ag.

19. The method according to claim 16, further comprising:
    polishing the barrier metal exposed on the insulating film.

20. The method according to claim 17, wherein the clean polishing removes an additive distributed in the upper portion of the conductive film formed by plating.

* * * * *